United States Patent
Sim et al.

(10) Patent No.: US 6,242,796 B1
(45) Date of Patent: *Jun. 5, 2001

(54) WIRING STRUCTURE OF SEMICONDUCTOR MEMORY DEVICE AND FORMATION METHOD THEREOF

(75) Inventors: Jae Kwang Sim; Sang Ho Lee, both of Cheongju (KR)

(73) Assignee: Hyundai Electronics Industries Co., Ltd., Kyoungki-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/985,509

(22) Filed: Dec. 5, 1997

(30) Foreign Application Priority Data

Dec. 6, 1996 (KR) .................................. 96-62262

(51) Int. Cl.[7] ........................... H01L 29/40; H01L 29/00; H01L 23/48
(52) U.S. Cl. ........................... 257/664; 257/508; 257/758
(58) Field of Search ................. 257/758, 664, 257/508

(56) References Cited

U.S. PATENT DOCUMENTS

| | | | |
|---|---|---|---|
| 3,698,082 | * 10/1972 | Hyltin et al. | 257/664 |
| 5,117,276 | * 5/1992 | Thomas et al. | 257/758 |
| 5,338,897 | * 8/1994 | Tsay et al. | 257/664 |
| 5,357,138 | * 10/1994 | Kobayashi | 257/664 |
| 5,614,439 | * 3/1997 | Murooka et al. | 257/758 |
| 5,665,644 | * 9/1997 | Sandhu et al. | 438/641 |
| 5,729,047 | * 3/1998 | Ma | 257/508 |
| 5,910,684 | * 6/1999 | Sandhu et al. | 257/758 |

* cited by examiner

*Primary Examiner*—Tom Thomas
*Assistant Examiner*—Ori Nadav

(57) ABSTRACT

Disclosed is a coaxial tube wiring structure (and method of making) of a semiconductor memory device for shielding a conductive film that transmits a signal. The coaxial tube structure includes: a plurality of signal conductive films formed on a substrate; and an arbitrary conductive film which shields the upper and lower surfaces and both sides of the signal conductive film, which is insulated from the signal conductive film by an insulating film, and to which ground voltage is applied.

2 Claims, 7 Drawing Sheets

WIRING STRUCTURE OF SEMICONDUCTOR MEMORY DEVICE AND FORMATION METHOD THEREOF

FIELD OF THE INVENTION

The present invention relates to a wiring line structure of a semiconductor, e.g., memory device and a formation method thereof for shielding a conductive film that transmits a signal of a semiconductor memory device.

BACKGROUND OF THE INVENTION

In a wiring structure of a semiconductor memory device, a wiring for transmitting a signal is composed of metal. As integration of semiconductor memory devices increases, a coupling effect between neighboring wiring increases. Therefore, a signal transmitted through the wiring loses an original shape, i.e., it becomes distorted.

As shown in FIG. 1, a wiring structure of a semiconductor memory device according to the conventional art includes a substrate 2 having a device (for example, a transistor, a capacitor) (not illustrated) formed on the upper surface thereof, an insulating film 3 composed of a material such as an oxide film on the upper surface of the substrate 2, and a first conductive film 4 (which serves as wiring for transmitting a signal) formed on the insulating film 3 by a photolithography. A coupling capacitance is generated by a coupling effect with a second neighboring conductive film 4.

As shown in FIG. 2A, it can be seen that there occurs a delay in a signal waveform Q2 at a point P2 in FIG. 1 in comparison with a signal waveform Q1 at a point P1. As shown in FIG. 2B, there occurs a overshooting, that is a distortion of a signal at a point P4 in comparison with a signal waveform Q3 at a point P3. Accordingly, in a semiconductor memory device, an error is caused by the inputting of a signal waveform Q4 at a point P4. For example, inverters (not illustrated) are respectively connected to either end of each conductive film 4, and when an input voltage (Vin) is switched from high level to low level, the input voltage (Vin) is inverted from low level into high level at the point P1. Here, when the voltage (Vcc) is inputted, voltage ground (Vss) must be maintained at the point P3, but there occurs an overshooting due to a coupling capacitance between neighboring conductive films, and at the point P4, the effect is gradually increased, resulting in an error of the inverter receiving an input at P4.

As shown in FIG. 3, the wiring structure of a semiconductor memory device according to another embodiment of the conventional art has a similar structure to that of FIG. 1, which includes a substrate 6 having a device (for example, a transistor, a capacitor) (not illustrated) formed on the upper surface thereof, an insulating film 7 composed of a material such as an oxide film on the upper surface, and conductive films 8,9 formed on the insulating film 7 by photolithography to serve as wiring. The conductive films 8,9 are alternatingly positioned, and ground voltage (Vss) is applied to the conductive film 9 so as to reduce a coupling capacitance between the conductive films 8,9. In the above structure, a distortion of a signal transmitted to the conductive film 8 can be partially reduced. However, the upper surface of the conductive film 8 is not shielded, so a capacitance caused by a coupling between the conductive films cannot be prevented. Therefore, distortion of a transmitted signal remains unimproved.

SUMMARY OF THE INVENTION

Accordingly, it is an object of the present invention to provide an improved wiring structure of a semiconductor memory device according to the present invention which is capable of reducing distortion of a transmitted signal by controlling, i.e., minimizing, a capacitance generated by a coupling between wiring.

It is another object of the present invention to provide an improved formation method for a wiring structure of a semiconductor memory device according to the present invention which is capable of reducing distortion of a transmitted signal by shielding a wiring.

To achieve the above object, there is provided an improved wiring structure of a semiconductor memory device according to a first embodiment of the present invention which includes: a plurality of first signal conductive films formed on a substrate; and a second shielding conductive film which shields a peripheral portion of the first conductive film, which is insulated from the first conductive film by an insulating film, and to which ground voltage is applied.

To achieve the above object, there is provided an improved method for forming a wiring structure of a semiconductor memory device according to the present invention which includes the steps of forming on a substrate a first conductive film to which a ground voltage is applied, forming a first insulating film on the first conductive film, forming a plurality of first grooves by selectively etching the first insulating film, forming a second conductive film on the first grooves and the first insulating film, forming a first pattern connected with the first conductive film and a second pattern not connected with the first conductive film, forming a second insulating film on the first insulating film including the first and second patterns, forming second grooves by selectively etching the second insulating film corresponding to the first pattern, and forming a third conductive film on the second insulating film including the second grooves.

These and other objects of the present invention are also achieved by providing a coaxial tube structure for a semiconductor device, the structure comprising: a substrate; a first signal conductor; a first insulator, coaxial to said first signal conductor; and a first shielding conductor structure, formed on said substrate, coaxial to said first insulator and said first signal conductor.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, wherein.

DETAILED DESCRIPTION OF THE PREFERRED EMBODIMENTS

A wiring structure of a semiconductor memory device and a formation method thereof according to the present invention will now be described in detail with reference to the accompanying drawings.

Figure 1:
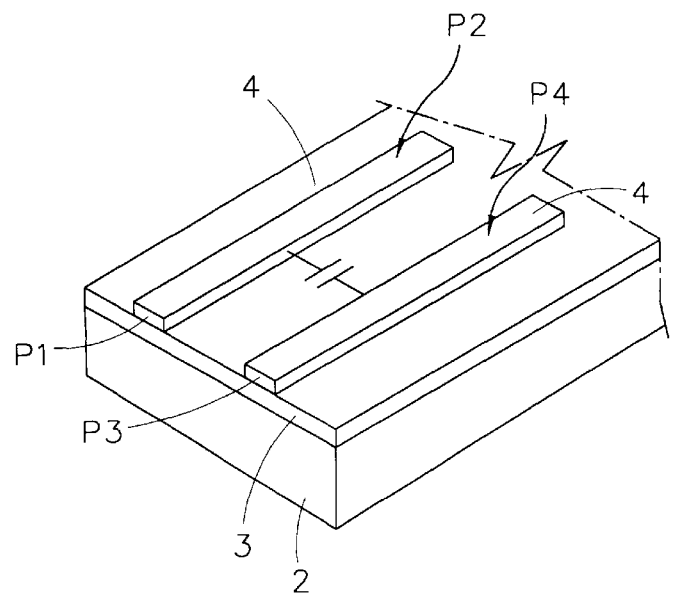
FIG. 1 is a schematic perspective view showing a wiring structure of a semiconductor memory device according to an embodiment of the conventional art.
Figure 2A:
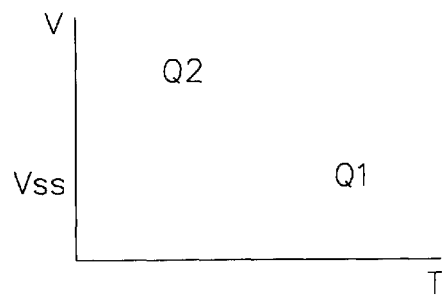
FIGS. 2A and 2B are signal waveform diagrams showing a signal waveform at each point of the conventional wiring structure in FIG. 1.
Figure 2B:
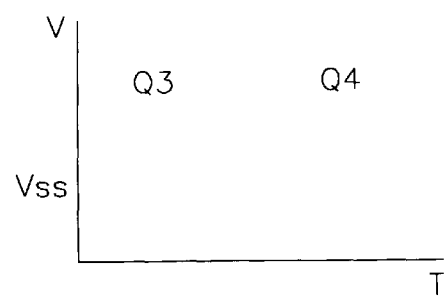
Figure 3:
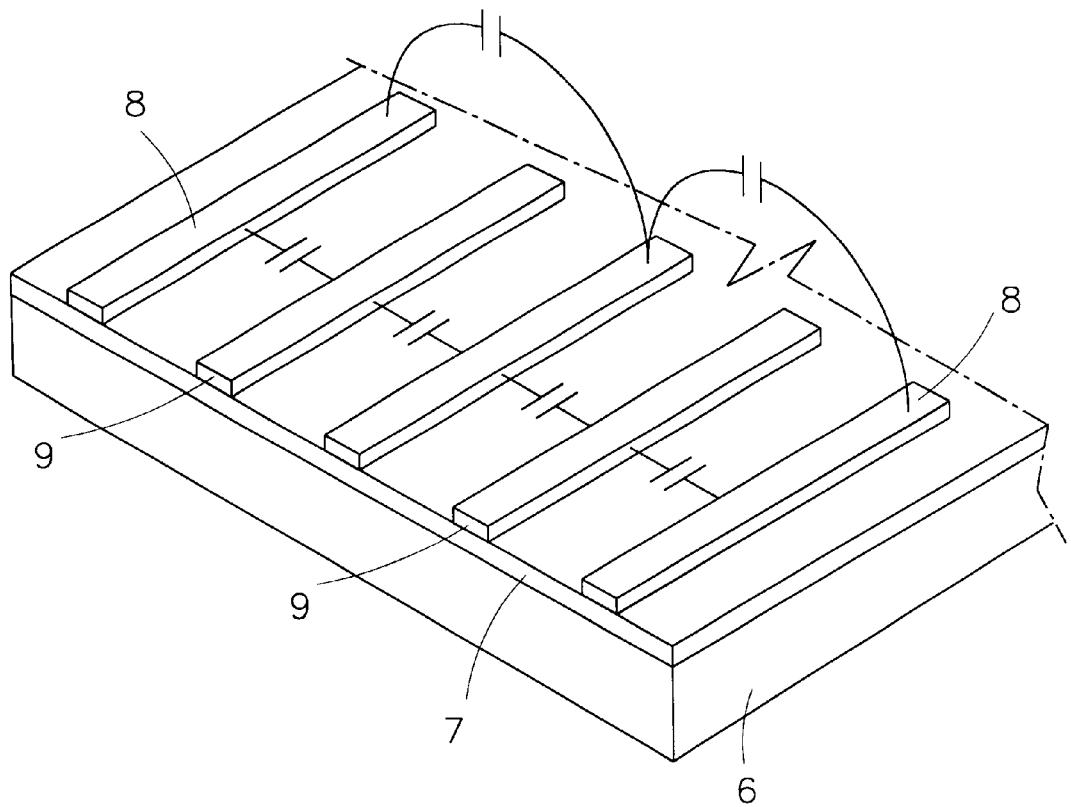
FIG. 3 is a schematic perspective view showing a wiring structure of a semiconductor memory device according to another embodiment of the conventional art.
Figure 4:
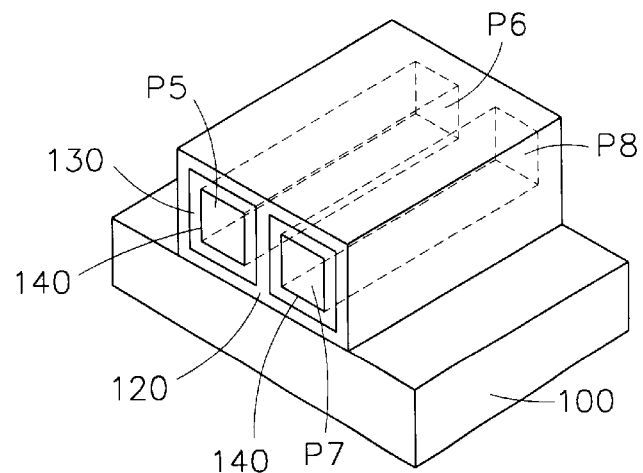
FIG. 4 is a schematic perspective view showing a wiring structure of a semiconductor memory device according to a first embodiment of the present invention.

As shown in FIG. 4, a wiring structure according to a first embodiment of the present invention includes: a substrate 100 having a device (for example, formed of transistors and/or capacitors) (not illustrated) formed thereon; a plurality of signal conductive films 140, e.g., a conductor such as an aluminum, for transmitting a signal and formed on the substrate 100 by photolithography; and an arbitrary conductive film 120 connected to ground voltage (Vss) and formed, e.g., of a conductor such as an aluminum. The signal conductive film 140 is separately formed to be shielded by the arbitrary conductive film 120. Between the signal conductive film 140 and the arbitrary conductive film 120, an insulating film 130, e.g., an oxide film is located so as to remove a coupling effect.

Figure 5:
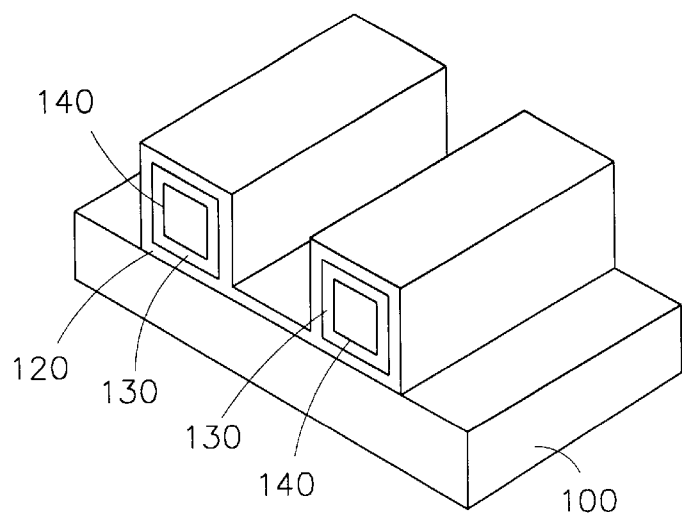
FIG. 5 is a schematic perspective view showing a wiring structure of a semiconductor memory device according to a second embodiment of the present invention.

FIG. 5 is a schematic perspective view showing a wiring structure of a semiconductor memory device according to a second embodiment of the present invention. Since the embodiment has a structure similar to that of the first embodiment, identical numerals are put on the identical elements. In this embodiment, the signal conductive films 140 are formed to have a predetermined space therebetween, and accordingly, the arbitrary conductive film 120 for shielding a peripheral portion of the signal conductive film 140 is also formed to have a predetermined space in a central portion and only the lower surface of the film 120 is connected. Between the signal conductive film 140 and the arbitrary conductive film, the insulating film 130 is filled so as to remove a coupling effect.

Figure 6:
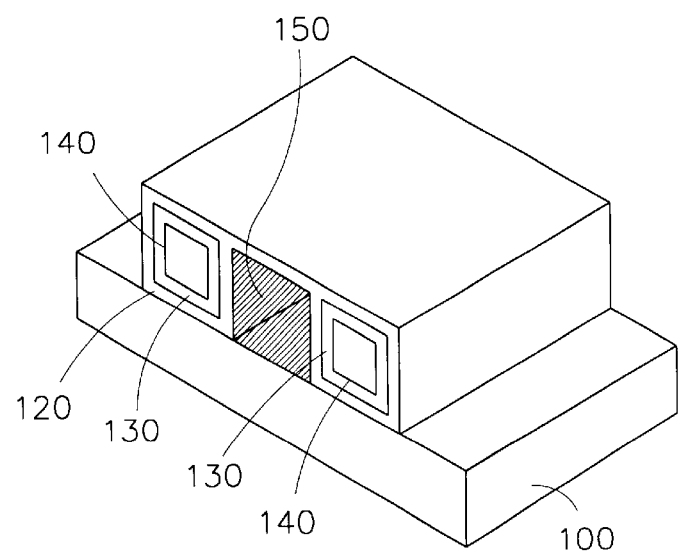
FIG. 6 is a schematic perspective view showing a wiring structure of a semiconductor memory device according to a third embodiment of the present invention.

FIG. 6 is a schematic perspective view showing a wiring structure of a semiconductor memory device according to a third embodiment of the present invention. Since the embodiment has a structure similar to that of the second embodiment, identical numerals are put on the identical elements. In this embodiment, the signal conductive films 140 are separately formed to have a predetermined space therebetween, and accordingly, the arbitrary conductive film 120 for shielding the signal conductive film 140 is also formed to have a predetermined space in a central portion, and only the upper surface of the film 120 is connected. Between the signal conductive film 140 and the arbitrary conductive film, the insulating film 130 is filled so as to remove a coupling effect.

Figure 7:
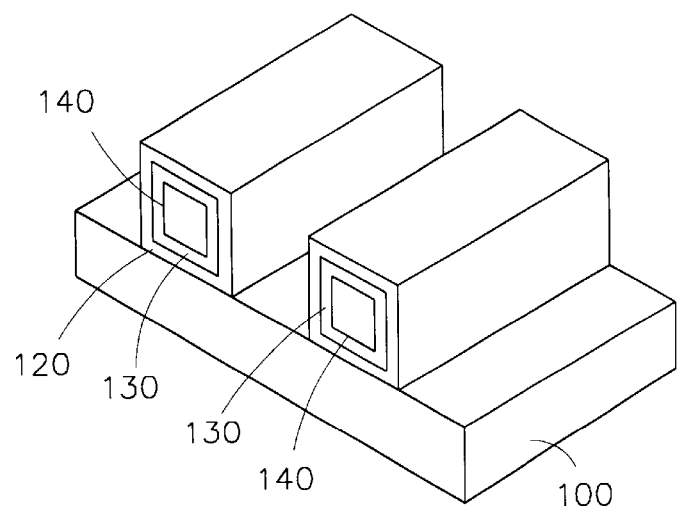
FIG. 7 is a schematic perspective view showing a wiring structure of a semiconductor memory device according to a fourth embodiment of the present invention.

FIG. 7 is a schematic perspective view showing a wiring structure of a semiconductor memory device according to a fourth embodiment of the present invention. Since the embodiment has a structure similar to that of the third and fourth embodiments, identical numerals are put on the identical elements. In this embodiment, the signal conductive films 140 are separately formed to have a predetermined space therebetween, and accordingly, the arbitrary conductive film 120 for shielding the signal conductive film 140 is also formed to have a predetermined space in a central portion. Between the signal conductive films 140 and the arbitrary conductive film 120, the insulating film 130 is filled so as to remove a coupling effect.

Referring to FIGS. 8A through 8H, description of a formation method for a wiring structure of a semiconductor memory device according to the present invention will now be given in detail.

Figure 8A:
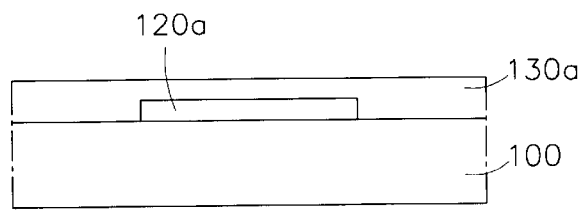
FIGS. 8A through 8H are views showing a formation method for a wiring structure of a semiconductor memory device in FIG. 4.

As shown in FIG. 8A, the substrate 100 is formed to have a device (for example, including transistors and/or capacitors) (not illustrated) formed thereon, a first conductive film 120a is formed on a predetermined surface of the substrate 100, and a first insulating film 130a, e.g., an oxide film, is formed on the first conductive film 120a and the substrate.

Figure 8B:
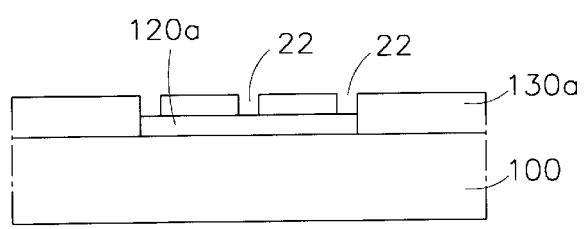

As shown in FIG. 8B, a plurality of first grooves 22 are formed by selectively etching a predetermined portion of the first insulating film 130a.

Figure 8C:
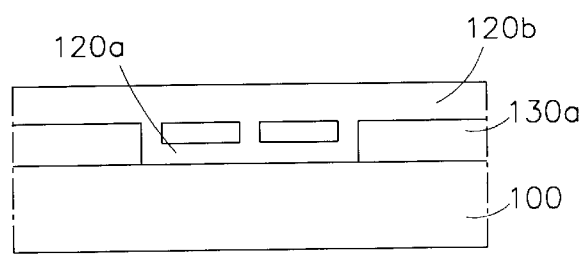

As shown in FIG. 8C, a second conductive film 120b is formed on the first insulating film 130a including the grooves 22. Here, the first grooves 22 are filled with the second conductive film 120b, which is connected with the conductive film 120a.

Figure 8D:
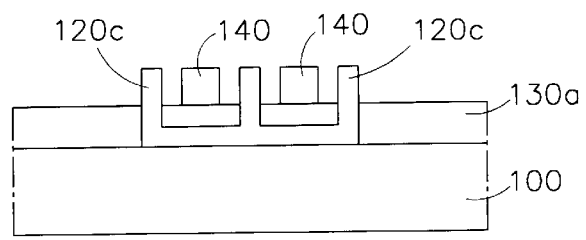

As shown in FIG. 8D, a first pattern 120c (connected with the first conductive film 120a) and a second pattern 140 (located between pairs of first patterns 120c and not connected with the first conductive films 120a), are respectively formed by selectively etching a predetermined portion of the second conductive film 120b. The second pattern 140 is to serve as a signal conductive film.

Figure 8E:
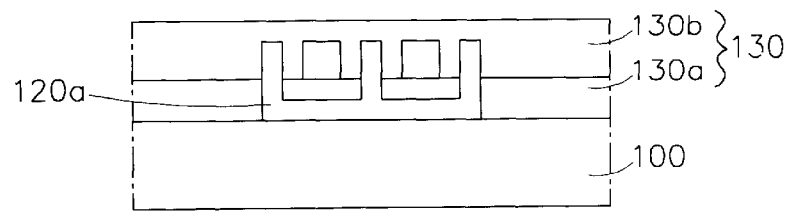

As shown in FIG. 8E, a second insulating film 130b is formed on the first and second patterns 120c,140 and the first insulating film 130a.

Figure 8F:
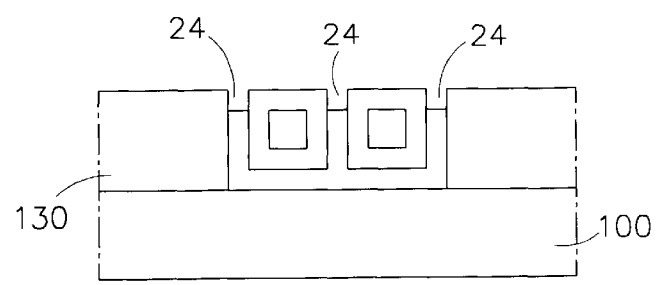

As shown in FIG. 8F, a plurality of second grooves 24 are formed by selectively etching a predetermined portion of the second insulation film 130a so as to expose an upper surface of the first pattern 120c.

Figure 8G:
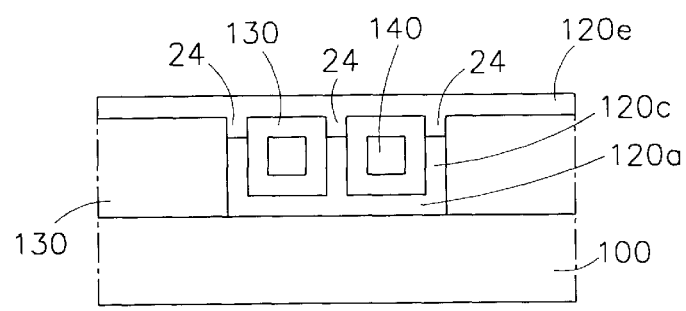

As shown in FIG. 8G, a third conductive film 120e is formed on the second insulating film 130b including the second grooves 24. Here, the second grooves 24 are filled with the third conductive film 120e to be connected with each other.

Figure 8H:
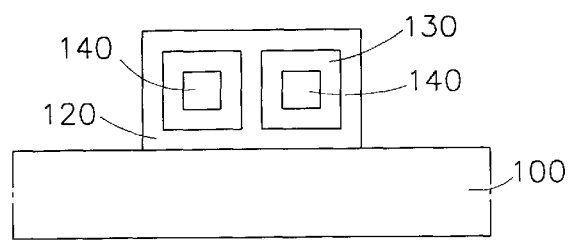

As shown in FIG. 8H, a predetermined portion of the third conductive film 120e and the insulating films 130 including the first and second insulating film 130a,130b are selectively etched away, thereby resulting in forming the arbitrary conductive film 120 surrounding the second pattern 140.

Figure 9:
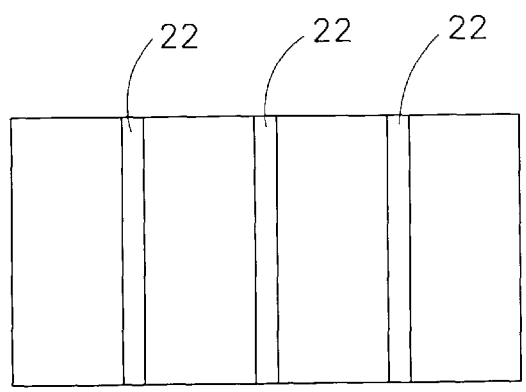
FIG. 9 is a plan view of FIG. 8B.

FIG. 9 is a plan view of FIG. 8B The first grooves 22 are formed in the shape of a strip to have a predetermined width in a length direction of the substrate 100.

Figure 10A:
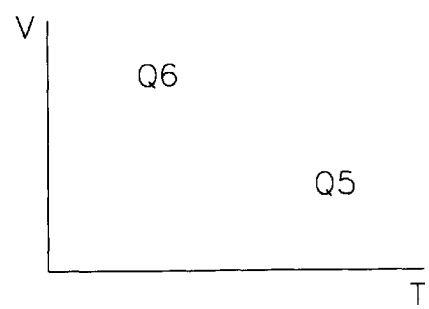
FIGS. 10A and 10B are views showing a signal waveform at each point of a wiring structure in FIG. 4.
Figure 10B:
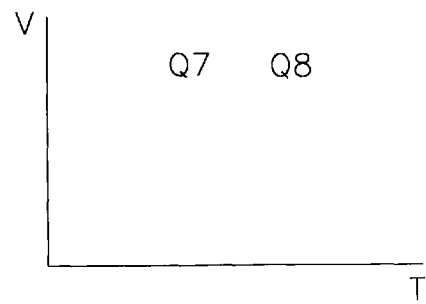

FIGS. 10A and 10B are views showing a signal waveform at each point of a wiring structure in FIG. 4. As shown in FIG. 10A, it can be seen that there occurs a little delay in a signal waveform Q6 of the first signal conductive film 140 at the point P6 in FIG. 4 in comparison with a signal waveform Q5 at the point P5. However, as shown in FIG. 10B, a signal waveform Q7 of the second signal conductive film 140 at a point P7 corresponds to a signal waveform Q8 at a point P8 without a distortion.

As described above, according to a wiring structure of a semiconductor memory device, a first signal conductive film for transmitting a signal is shielded by an arbitrary conductive film so as to control a capacitance generated by a coupling effect with a second neighboring signal conductive film, and thereby to prevent a distortion of a transmitted signal waveform.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A shielded wiring structure of a semiconductor device, the structure comprising:

a substrate;

a first rectangular coaxial tube structure formed on said substrate, said first rectangular coaxial tube structure having a first inner conductor and a first conductive coaxial shield;

a second rectangular coaxial tube structure formed on said substrate, said second rectangular coaxial tube structure having a second inner conductor and a second conductive coaxial shield, said second coaxial shield being discrete from said first coaxial shield;

said first coaxial tube structure being located a predetermined distance away from said second coaxial tube structure;

sidewalls of said first coaxial tube structure being elements of no coaxial tube structure other than said first coaxial tube structure;

sidewalls of said second coaxial tube structure being sidewalls of no coaxial tube structure other than said second coaxial tube structure;

wherein said first coaxial shield being electrically connected to said second coaxial shield;

wherein top sides of said first and second rectangular coaxial tube structures are connected together by a third conductor having a planar surface; and wherein said third conductor being an element of no coaxial tube structure other than said first and second coaxial tube structures wherein a space is defined between said substrate, said third conductor and sidewalls of said first and second rectangular coaxial tube structures, the shielded tube structure further comprising a third insulator that fills in said space.

2. The shielded wiring structure of claim 1, wherein the first conductive coaxial shield is grounded.

* * * * *